United States Patent [19]
Zambrano et al.

[11] Patent Number: 5,691,555
[45] Date of Patent: Nov. 25, 1997

[54] INTEGRATED STRUCTURE CURRENT SENSING RESISTOR FOR POWER DEVICES PARTICULARLY FOR OVERLOAD SELF-PROTECTED POWER MOS DEVICES

[75] Inventors: Raffaele Zambrano, Catania, Italy; Richard A. Blanchard, Los Altos, Calif.

[73] Assignee: Consorzio per la Ricerca sulla Microelettronica nel Mezzogiorno, Catania, Italy

[21] Appl. No.: 598,394

[22] Filed: Feb. 8, 1996

Related U.S. Application Data

[63] Continuation-in-part of Ser. No. 481,198, Jun. 7, 1995, Pat. No. 5,491,357, which is a continuation of Ser. No. 242,261, May 13, 1994, abandoned.

[30] Foreign Application Priority Data

May 19, 1993 [EP] European Pat. Off. ............ 93830207

[51] Int. Cl.[6] .................................................. H01L 29/78
[52] U.S. Cl. ........................ 257/332; 257/334; 257/337
[58] Field of Search ............................ 257/330, 337, 257/338, 339, 332, 334, 331

[56] References Cited

U.S. PATENT DOCUMENTS

| | | | |
|---|---|---|---|
| 5,034,785 | 7/1991 | Blanchard | 257/330 |
| 5,410,170 | 4/1995 | Bulucea et al. | 257/330 |

FOREIGN PATENT DOCUMENTS

| | | | |
|---|---|---|---|
| A-38 21 065 | 1/1989 | Germany . | |
| A-62-143450 | 6/1987 | Japan . | |
| 4-100276 | 4/1992 | Japan | 257/334 |
| WO 89/08928 | 9/1989 | WIPO | 257/334 |
| WO 91/09424 | 6/1991 | WIPO . | |

OTHER PUBLICATIONS

Goodenough, "Trench-Gate DMOSFETs In SO-8 Switch 10 A At 30 V," *Electronic Design*: 65-72, 1995.

*Primary Examiner*—Donald Monin
*Attorney, Agent, or Firm*—David V. Carlson; Bryan A. Santarelli; Seed and Berry LLP

[57] ABSTRACT

In integrated structure sensing resistor for a power MOS device consists of a doped region extending from a deep body region of at least one cell of a first plurality of cells, constituting a main power device, to a deep body region of a corresponding cell of a second smaller plurality of cells constituting a current sensing device. The first plurality of cells and the second plurality of cells are formed using trench technology.

13 Claims, 8 Drawing Sheets

INTEGRATED STRUCTURE CURRENT SENSING RESISTOR FOR POWER DEVICES PARTICULARLY FOR OVERLOAD SELF-PROTECTED POWER MOS DEVICES

CROSS-REFERENCES TO RELATED APPLICATIONS

This application is a Continuation-in-Part of U.S. patent application No. 08/481,198, filed Jun. 7, 1995, now U.S. Pat. No. 5,491,357, which is a File Wrapper Continuation of U.S. patent application Ser. No. 08/242,261, filed May 13, 1994, now abandoned.

TECHNICAL FIELD

The present invention relates generally to an integrated structure current sensing resistor for power devices, and more particularly, to an overload self-protected power MOS device.

BACKGROUND OF THE INVENTION

Power MOS devices can feature integrated circuitry suitable to protect the power device against excessive current flow, due for example to an output load short-circuit.

A typical solution provides for a negative feedback loop, which comprises a current sensing MOSFET, whose drain and gate are respectively connected to the drain and the gate of the main power MOSFET, and whose source is connected, through a current sensing resistor, to the source terminal of the integrated component. The base-emitter junction of a bipolar junction transistor (BJT) is connected across said sensing resistor, while the collector of the BJT is connected to the common gate of the two MOSFETs. A gate resistor is finally connected in series between an external gate terminal of the integrated component and the common gate.

In practical implementations, both the sensing MOSFET and the main power MOSFET are made up of similar cells, even if the latter comprises a much larger number of such cells than the former.

The current flowing through the sensing MOSFET, which is a small fraction of the current flowing through the main power MOSFET, generates a voltage drop across the sensing resistor whose value is chosen in such a way that when the current flowing through the power MOSFET exceeds a prescribed maximum value, the fractional current flowing through the sensing resistor generates a voltage drop sufficient to turn on the BJT. By draining current from the gate resistor through the BJT, the voltage applied to the gate of the two MOSFETs decreases, thus preventing the current flowing through them from further increasing.

Furthermore, the positive thermal coefficient of such feedback loop improves the protecting performances of this protection circuit, since at higher temperature the maximum value for the current decreases.

In the International Application No. WO 91/09424, a power device is described which includes in the same substrate as the power transistor a feedback loop of the type described above. The sensing resistor is made up of a polysilicon strip obtained simultaneously with the polysilicon gate layer of the MOS cells.

This solution requires a dedicated area on the substrate surface to allocate the sensing resistor, which is external to the sequence of source cells.

SUMMARY OF THE INVENTION

In view of the state of the art described, the object of the present invention is to provide an integrated structure sensing resistor which reduces the area used on the substrate surface.

According to the present invention, such object is attained by means of an integrated structure current sensing resistor for a power MOS device comprising a main power device and a current sensing device respectively made up of a first plurality and a second plurality of substantially identical cells arranged in an array, each of them comprising a deep body region of a first conductivity type obtained in a semiconductor material of a second conductivity type, a lateral channel region of said first conductivity type and a source region of said second conductivity type extending partially in said deep body region and partially in said lateral channel region, a conductive gate layer, insulated from a top surface of the semiconductor material by a thin gate oxide layer superimposed over said channel region, the deep body region and the source region of each cell of said first and second pluralities being electrically connected to each other and to all the other cells of the same plurality by means of respective first and second superimposed conductive source electrodes, characterized in that said resistor consists of at least one doped region extending from the deep body region of at least one cell of the first plurality to the deep body region of a corresponding cell of the second plurality.

In a first embodiment of the present invention, the integrated structure current sensing resistor consists of an extended deep body region of the first conductivity type, extending from and connecting the deep body region of said at least one cell of the first plurality to the deep body region of said corresponding cell of the second plurality.

In a second embodiment of the present invention, the integrated structure current sensing resistor consists of a semiconductor region of the second conductivity type, arranged within an extended deep body region of the first conductivity type extending from and connecting the deep body region of said at least one cell of the first plurality to the deep body region of said corresponding cell of the second plurality.

In a third embodiment of the present invention, the integrated structure current sensing resistor consists of a body region of the first conductivity type extending from and connecting the deep body region of said at least one cell of the first plurality to the deep body region of said corresponding cell of the second plurality.

In a fourth embodiment of the present invention, the first plurality of power cells and the second plurality of sensing cells are formed using conventional trench technology.

Thanks to the present invention, it is possible to obtain an integrated structure current sensing resistor without introducing irregularities in the array of cells of the power device, consequently reducing the area required.

BRIEF DESCRIPTION OF THE DRAWINGS

Three embodiments of the present invention will now be described in greater detail with reference to the annexed drawings.

DETAILED DESCRIPTION OF THE INVENTION

A power MOS device, for example an n-channel power MOSFET, is made up of a plurality of cells 1a and 1b, each comprising a high doped p+ deep body region 2, extending from a top surface of a semiconductor material into a low doped n– epitaxial layer 3. The n– epitaxial layer 3 is grown over a high doped n+ substrate 4 and represents a drain region of the power MOSFET. On one side of said p+ deep body region 2, a low doped p– channel regions 5 is provided, and a highly doped n+ source region 6 extends partially in the p+ deep body region 2 and partially in said channel region 5. A polysilicon gate layer 7, insulated from the top surface of the semiconductor by a thin gate oxide layer 8, is superimposed over said channel region 5 to allow, under particular biasing conditions, the formation of a conductive channel.

An array of cells 1a, connected each other by means of a first source electrode layer Sa which contacts their p+ deep body region 2 and their n+ source region 6, constitutes a main power MOSFET, while a smaller array of cells 1b, which are in turn connected each other in the same way by means of a second source electrode layer Sb, constitutes a sensing MOSFET.

Figure 1:
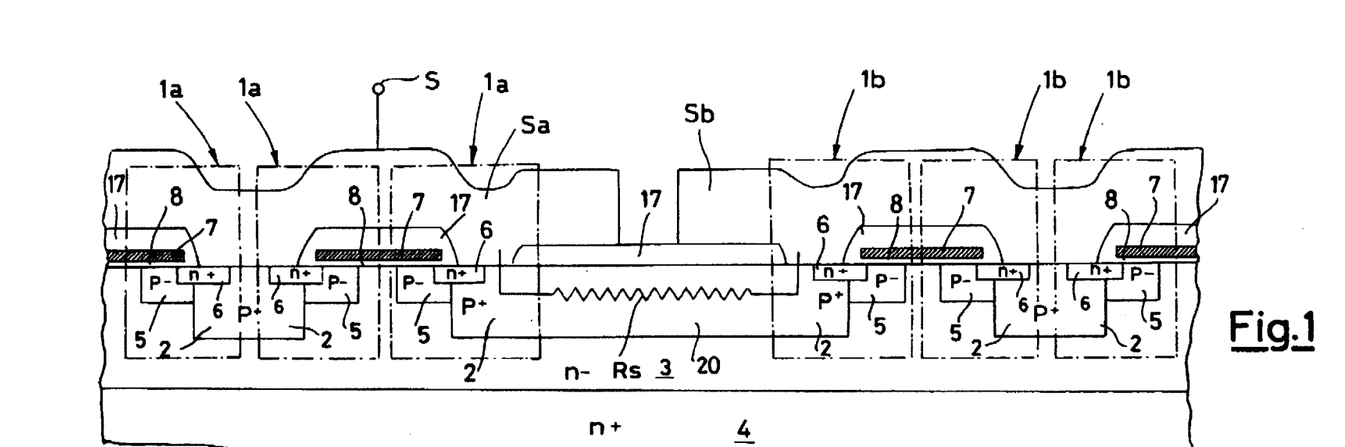
FIG. 1 is a cross-sectional view of an integrated structure current sensing resistor according to a first embodiment of the invention.

In a first embodiment, shown in FIG. 1, the p+ deep body region 2 of at least one of the main power MOSFET's cells 1a is laterally extended in order to be merged with the p+ deep body region 2 of a corresponding cell 1b of the sensing MOSFET, and an extended deep body region 20 is thus obtained which is contacted on opposite sides by the source electrodes Sa and Sb respectively. Such source electrodes Sa and Sb are thus electrically connected by the extended p+ deep body region 20, which introduces, in series connection to the source electrode Sb of the sensing MOSFET, a sense resistor Rs.

Figure 2:
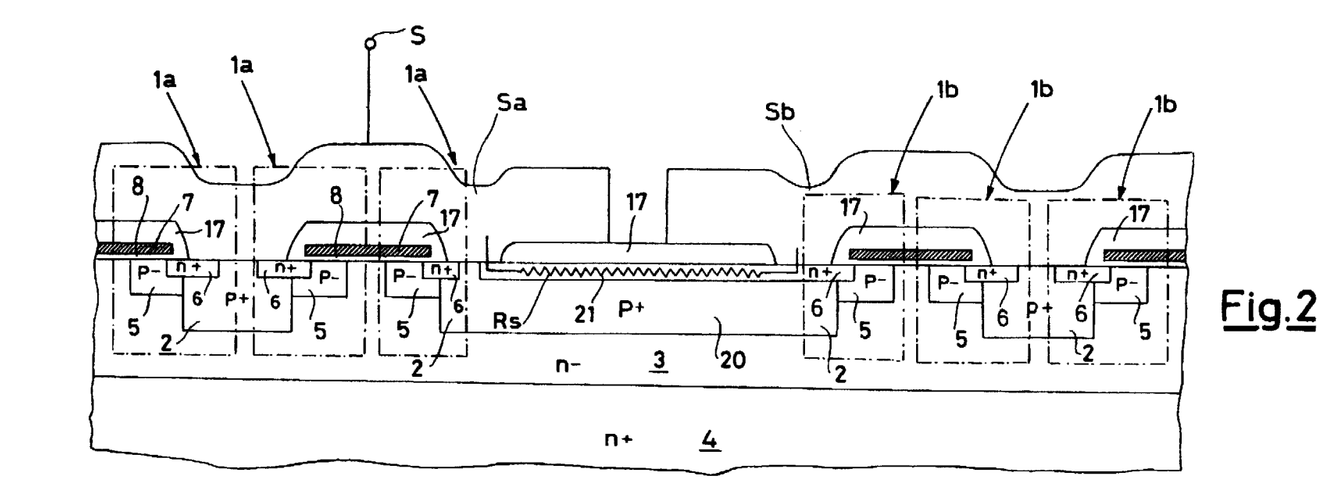
FIG. 2 is a cross-sectional view of an integrated structure current sensing resistor according to a second embodiment of the invention.

In a second embodiment, shown in FIG. 2, the p+ deep body region 2 of at least one of the main power MOSFET's cells 1a is again extended and merged with the p+ deep body region 2 of a corresponding cell 1b of the sensing MOSFET, to obtain, as in the previous embodiment, an extended deep body region 20. An extended n+ semiconductor region 21 is then provided within the deep body region 20 and is merged with the n+ source region 6 of said corresponding cell 1b. The source electrodes Sa and Sb contact two sides of the extended n+ semiconductor region 21, which introduced, in series connection between the source electrodes Sa and Sb, a sense resistor Rs'. The extended p+ deep body region 20 insulates the extended n+ semiconductor region 21 from the n– epitaxial layer 3, and is connected to the source electrode Sa to prevent all parasitic actions.

The first source electrode Sa is also connected to an external source terminal S of the integrated component.

The polysilicon gate layer 7 is connected, through an integrated gate resistor not shown in the drawings, to a gate terminal, while a bipolar junction transistor, equally not shown, has its base-emitter junction connected across the sense resistor Rs'. A negative feedback loop of the type described before is thus obtained.

Figure 3:
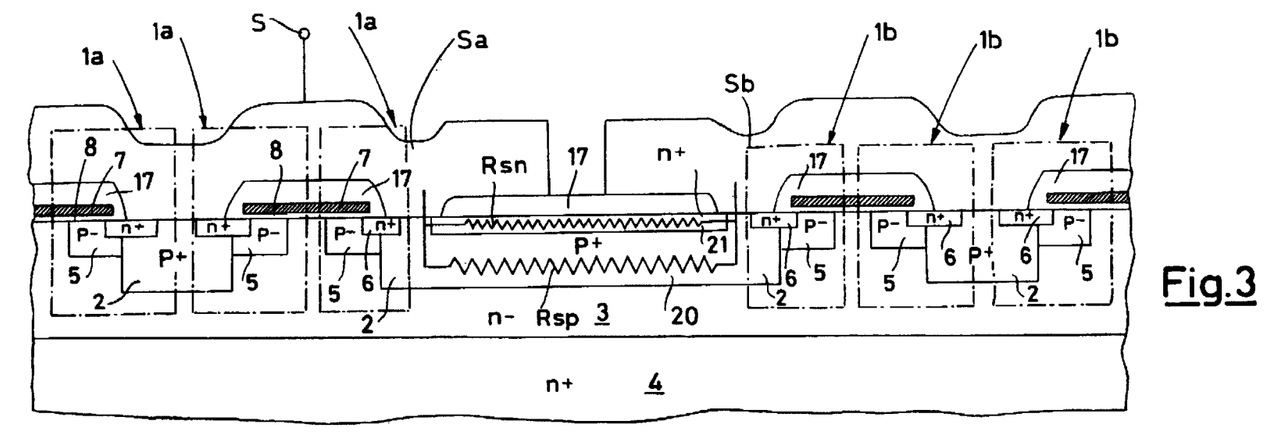
FIG. 3 is a cross-sectional view of an integrated structure current sensing resistor according to a variation of said second embodiment.

In a variation of the second embodiment, shown in FIG. 3, the extended p+ deep body region 20 and the extended n+ semiconductor region 21 are both contacted on opposite sides, thus introducing, in series connection between source electrodes Sa and Sb, two parallelly connected resistors Rsp and Rsn.

Figure 4:
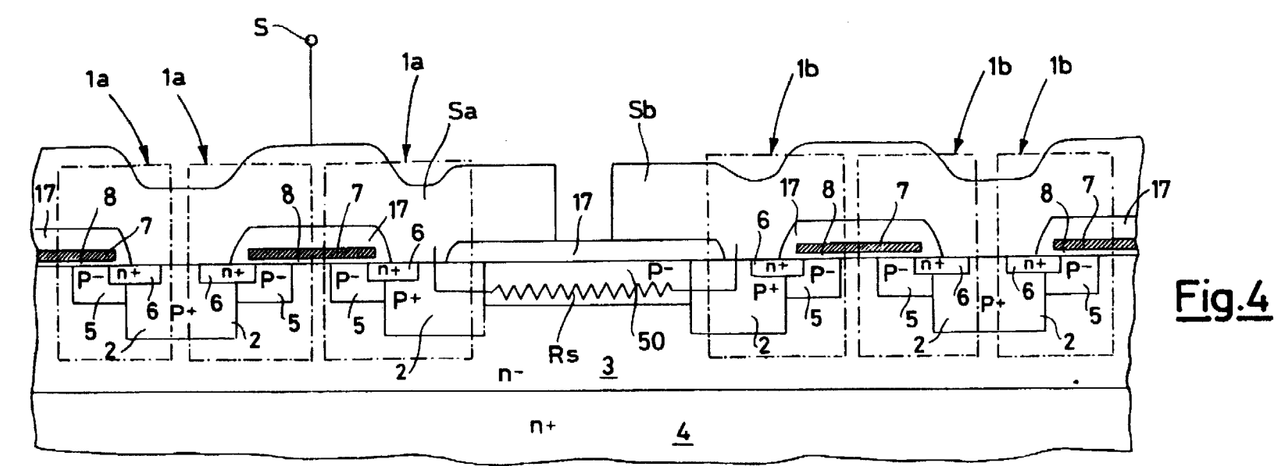
FIG. 4 is a cross-sectional view of an integrated structure current sensing resistor according to a third embodiment of the invention.

In a third embodiment shown in FIG. 4, there is no extended p+ deep body region; a p– body region 50 is formed so as to connect the deep body region 2 of at least one cell 1a of the first plurality to the deep body region 2 of a corresponding cell 1b of the second plurality, serially connecting the cells 1a and 1b through a resistor Rs". Since the resistivity of the p– regions is considerably higher than that of the p+ regions, the resistance introduced by the body region 50 is considerably higher than that introduced by the region 20 of the previous embodiments.

In all of the described embodiments, there can be several extended regions connected in parallel between the first and the second pluralities of cells: the resistance between the two source regions will be given by the parallel computation of all of them.

A fabrication process suitable to obtain a power MOS device featured by the integrated structure current sensing resistor according to the first embodiment of the present invention is shown in FIGS. 5–9 and includes the same steps of a known process for the fabrication of a power MOS device. The fabrication process starts with the growth of the low-doped epitaxial layer 3, for example of the n– type, over the highly-doped semiconductor substrate 4, in this example of the n+ type.

Figure 5:
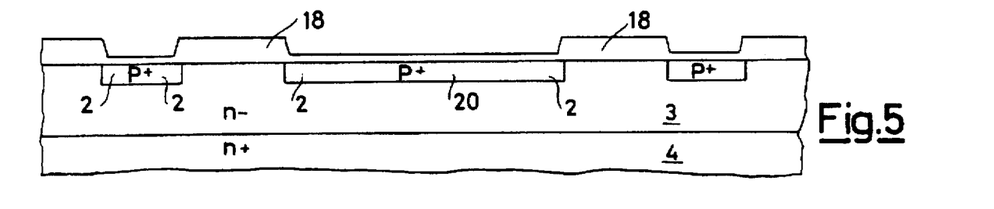
FIGS. 5–9 are cross-sectional views of a sequence of steps in a fabrication process of a power MOS device provided with the integrated structure current sensing resistor according to the first embodiment of the invention.

After a field oxide layer 18 has been grown, a masked implantation and subsequent diffusion of a high concentration of a p type dopant is performed, in order to form the plurality of p+ deep body regions 2 constituting the main and sensing cells 1a and 1b of the power MOSFET, and the extended p+ deep body region 20 (FIG. 5).

Figure 6:
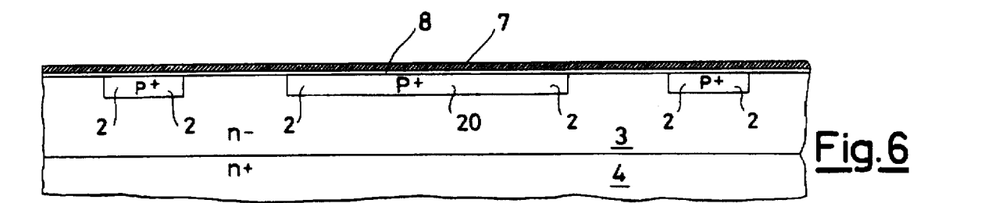

After a masking step, active areas are defined, on the surface of the epitaxial layer 3, a thin gate oxide layer 8 is then grown over said active areas, and a polysilicon gate layer 7 is subsequently deposited over said gate oxide layer 8, and doped to achieve low resistivity (FIG. 6).

Figure 7:
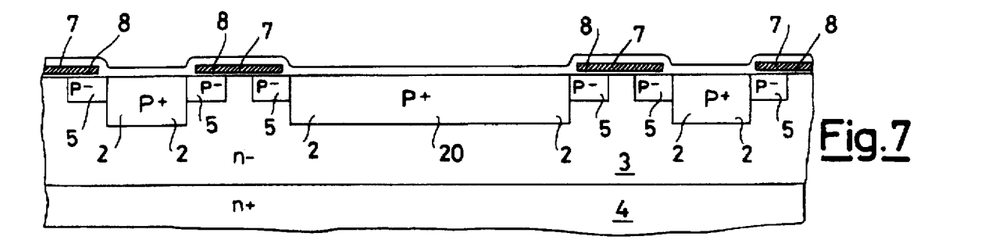

The polysilicon gate layer 7 is then selectively etched outside said gate regions, and after a masking step, a low concentration of a p type dopant is implanted and diffused under said gate regions to form p– type channel regions 5 of each cell 1a and 1b of the power MOSFET (FIG. 7).

Figure 8:
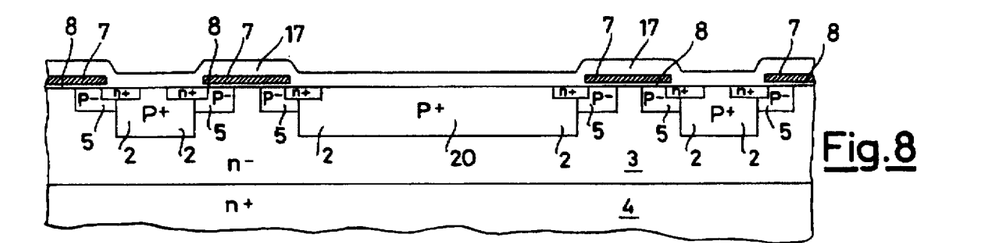

The following step is the masked implant and diffusion of a high concentration of an n type dopant at the sides of said gate regions, to form the source regions 6 of the cells 1a and 1b, and the deposition of an insulating oxide layer 17 over the polysilicon gate layer 7 (FIG. 8).

Figure 9:
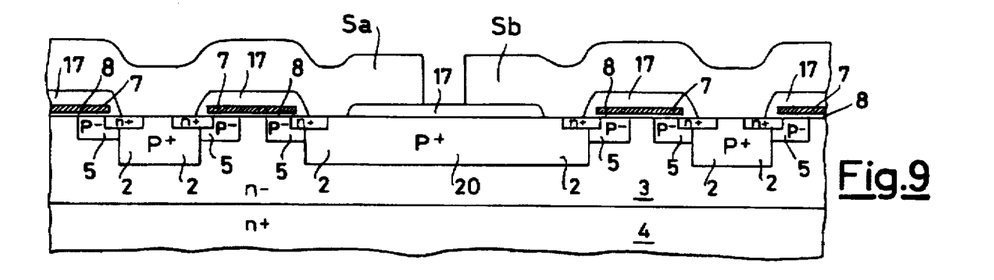

The final steps of the process involve the definition of contact areas, the deposition of a conductive layer suitable to form the two source electrodes Sa and Sb, and the deposition of a passivating layer (FIG. 9).

The metallization of the bottom surface of the substrate 4 is also provided, in order to form a contact to the drain of the power MOSFET.

Figure 10:
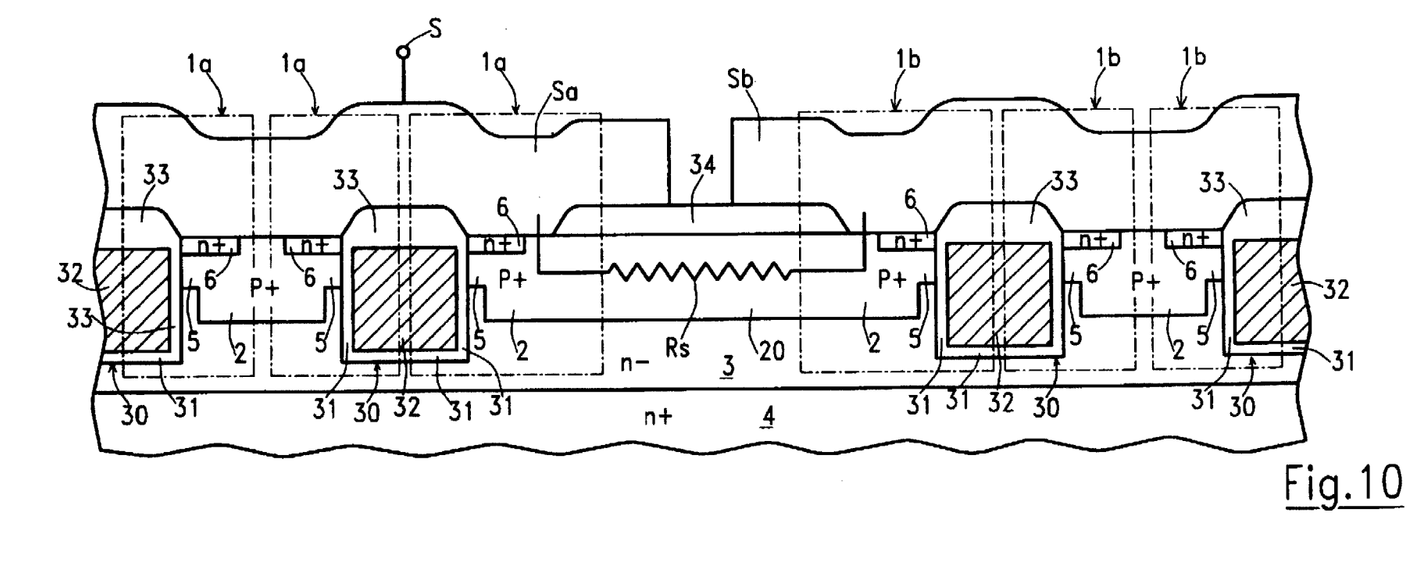
FIG. 10 is a cross-sectional view of an integrated structure current sensing resistor and power and sensing cells according to a fourth embodiment of the invention.

FIG. 10 shows in cross-sectional view a power MOS device according to the present invention that is manufactured using conventional trench technology. The same reference numerals as in the preceding FIGS. 1–9 have been adopted to indicate similar regions. As discussed above in conjunction with FIGS. 1–4, the power MOS device is made up of one or more cells 1a and 1b, formed in a lightly doped n– epitaxial layer 3. Each of the cells 1a and 1b includes a heavily doped p+ deep body region 2, a lightly doped p– channel region 5, and a heavily doped n+ source region 6. The cells 1a and 1b are separated from adjacent cells by vertical trenches 30, which are formed in the epitaxial layer 3. The walls of the trenches 30 are coated with a thin gate oxide layer 31, and are then filled with polysilicon 32 to form the gate electrodes of the cells 1a and 1b. An insulator 33, for example, silicon dioxide, covers the exposed surfaces of the polysilicon 32 in the trenches 30.

The first array of cells 1a, which are connected to each other by a first source electrode Sa that contacts their p+ deep body regions 2 and their n+ source regions 6, composes a main power MOS device. The second, often smaller array of cells 1b, which are coupled to each other by a second source electrode Sb, composes a sensing MOS device. The p+ deep body region 2 of at least one of the main power cells 1a is elongated and merged with the p+ deep body region 2 of a corresponding cell 1b of the sensing device. A dielectric layer 34 covers this extended deep body region 20, and the source electrodes Sa and Sb contact the region 20 on opposite sides thereof. Thus, the extended p+ deep body region 20 introduces an integrated series sense resistor Rs between the source electrodes Sa and Sb.

Referring to FIGS. 11–18, a process is described for manufacturing the power MOS device shown in FIG. 10 using conventional trench technology.

Figure 11:
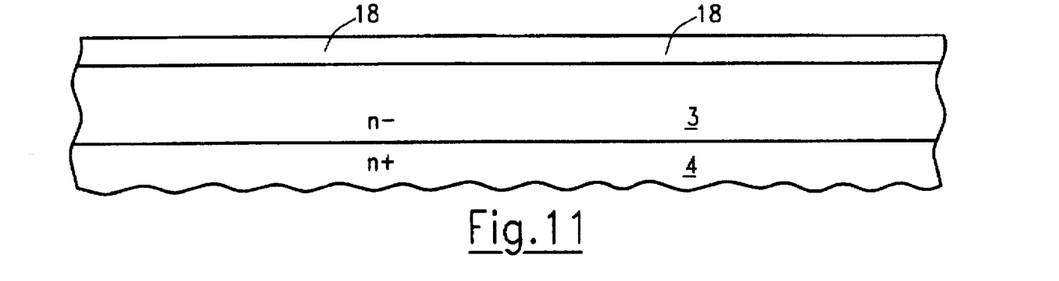
FIGS. 11–18 illustrate a first embodiment of the fabrication process for the integrated structure of FIG. 10.

Referring to FIG. 11, a lightly doped n-type epitaxial semiconductor layer 3 is grown over a heavily doped n-type silicon substrate 4. A thick oxide layer 18 is then formed over the surface of the epitaxial layer 3.

Figure 12:
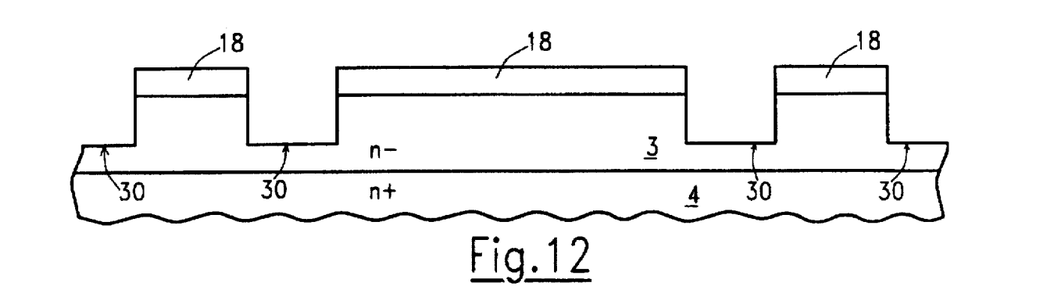

Referring to FIG. 12, trenches 30 are formed in the oxide layer 18 and in the epitaxial layer 3. In one embodiment of the invention, selective etching is used to form the trenches 30. First, a photoresist layer (not shown) is deposited on the field oxide layer 18. Next, the photoresist layer is selectively exposed to a light source through a suitable mask. Then, the portions of the photoresist layer covering the portions of the oxide layer 18 where the trenches are to be formed are etched away.

Figure 13:
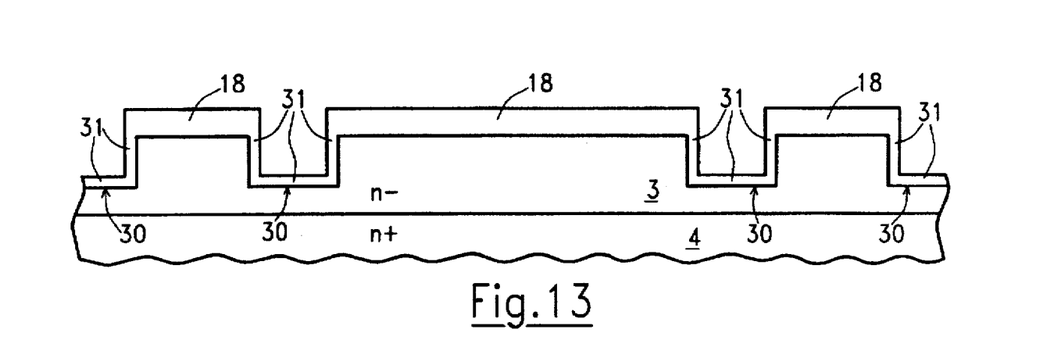

Referring to FIG. 13, a thin insulation layer 31, which is typically formed from an oxide, is grown on the walls of the trenches 30. The insulator layer 31 forms the gate oxide of the MOS power device and the gate oxides of the MOS sense device.

Figure 14:
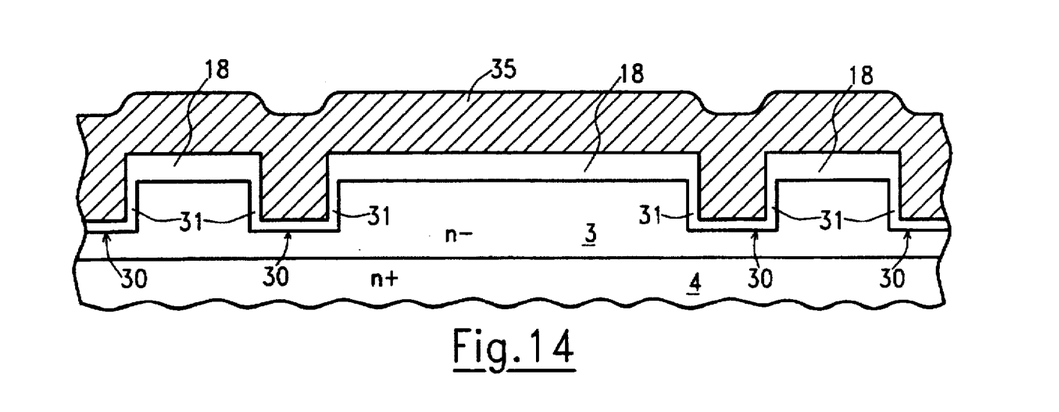

Referring to FIG. 14, a polysilicon layer 35 is deposited over the layer 18, and within the trenches 30, such that the trenches 30 are filled with polysilicon to form the gates of the MOS power and sensing devices.

Figure 15:
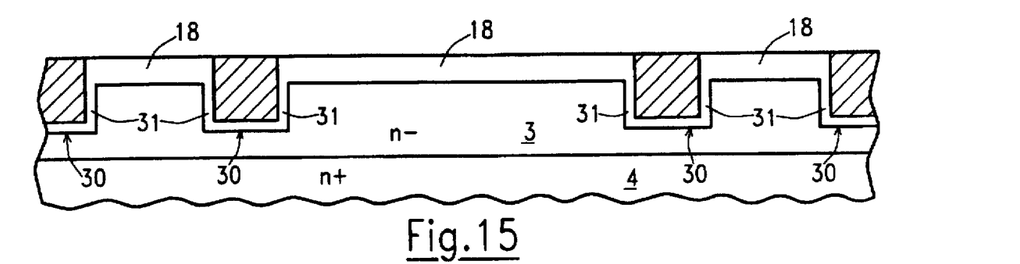

Referring to FIG. 15, portions of the polysilicon layer 35 are then removed using an etch back process to expose the oxide layer 18. The trenches 30, however, remain filled with the polysilicon.

Figure 16A:
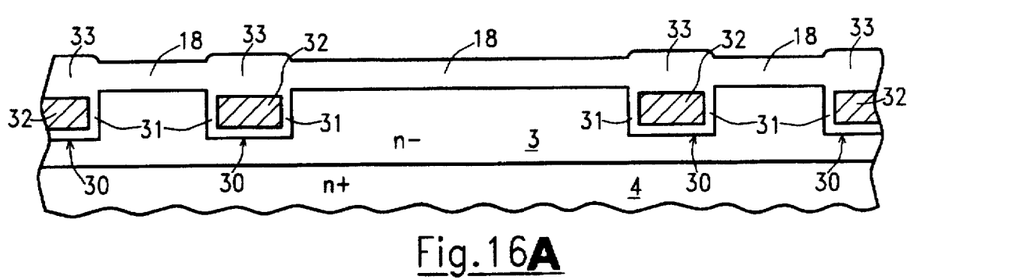
Figure 16B:
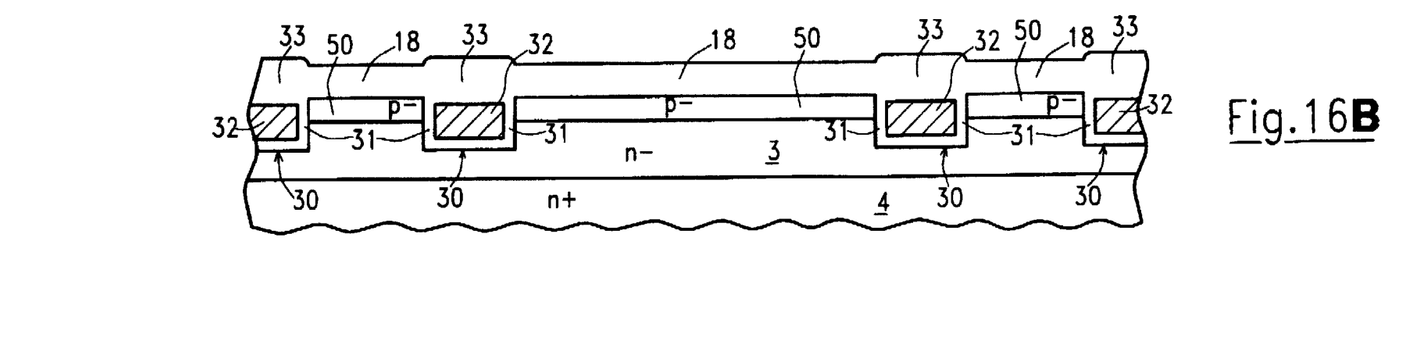

Referring to FIGS. 16A and 16B, insulator caps 33, which are typically formed from silicon dioxide, are formed over the exposed polysilicon in the trenches 30. Next, the oxide layer 18 is removed from the active areas of the structure where the cells 1a and 1b and the integrated sensing resistor Rs will be formed. Referring to FIG. 16B, in an alternate embodiment of the invention, a lightly doped p– epitaxial layer 50 is formed on the epitaxial layer 3. As shown, in this embodiment, the epitaxial layer 3 is often thinner than it would be in embodiments where the epitaxial layer 50 is not formed. Also in this embodiment, portions of the epitaxial layer 50 form the body regions 2 of the vertical MOSFETs, with the channel regions 5 formed along the vertical surfaces of the body regions 2.

Figure 17:
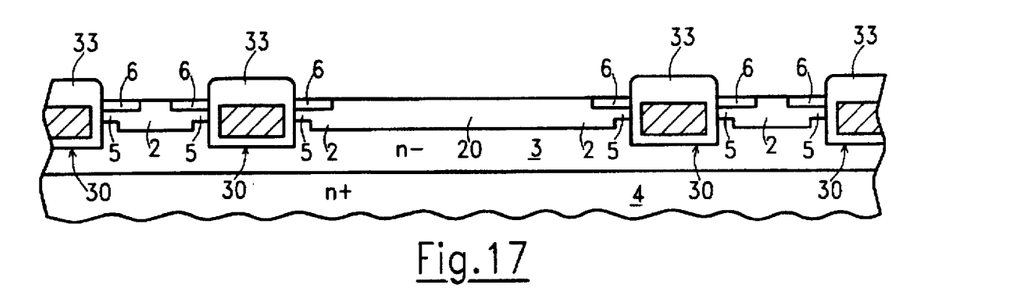

Referring to FIG. 17, the heavily doped p-type deep body regions 2, and lightly doped p-type channel regions 5 are formed in the exposed active areas with a masked implantation of dopants. (As discussed above with reference to FIG. 16B, where an epitaxial layer 50 is grown, the masking scheme is different than where the epitaxial layer 50 is not grown, as is known to one of ordinary skill in the art.) During the same step, the extended deep body region 20 is formed. Heavily doped n-type source regions 6 are also formed inside the deep body regions 2 and the channel regions 5 such that the deep body region 20, which includes the deep body regions 2, is contiguous with both of the source regions 6 of the adjacent power and sensing cells, and with both of the channel regions 5.

Figure 18:
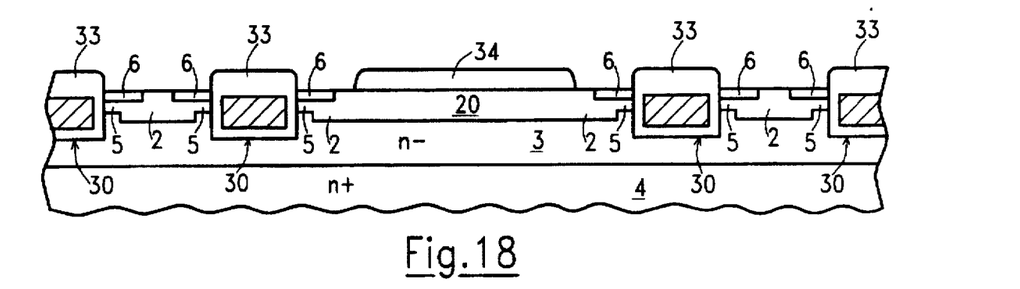

Referring to FIG. 18, an intermediate dielectric layer 34 is then deposited on the device and patterned appropriately. A metal layer is then formed over the structure and is selectively removed to define the two source electrodes Sa and Sb as shown in FIGS. 1–4.

FIGS. 19–26 illustrate an alternative process for forming the structure as shown in FIG. 10 using conventional trench technology.

Figure 19:
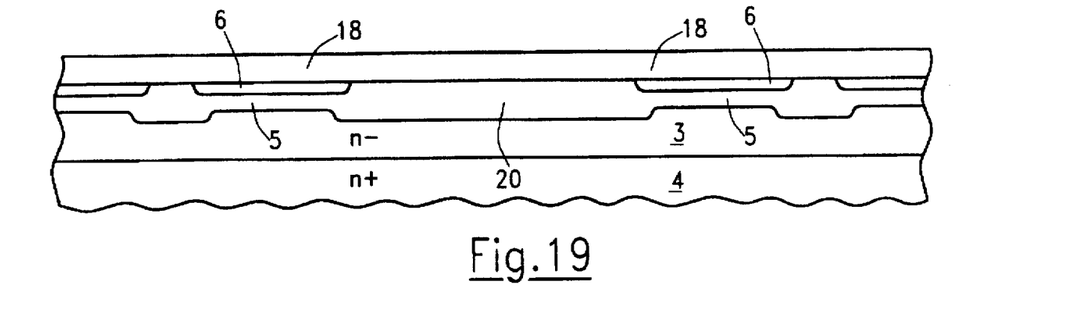
FIGS. 19–26 illustrate a second embodiment of the fabrication process for the structure of FIG. 10.

Referring to FIG. 19, the lightly doped n-type semiconductor layer 3 is grown over the heavily doped substrate 4. Next, the oxide layer 18 is formed on the epitaxial layer 3. Then, using the appropriate masks, the p– channel regions 5, n+ source regions 6, and the extended deep body region 20 are formed in the layer 3.

Figure 20:
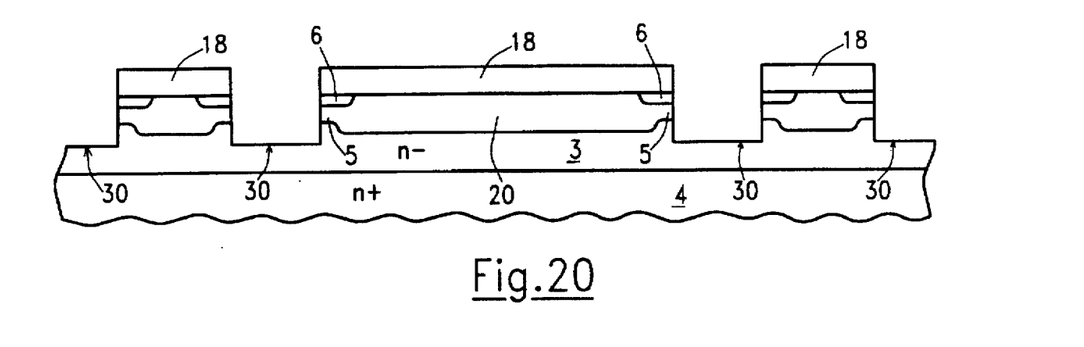

Referring to FIG. 20, the trenches 30 are formed in the layer 3.

Figure 21:
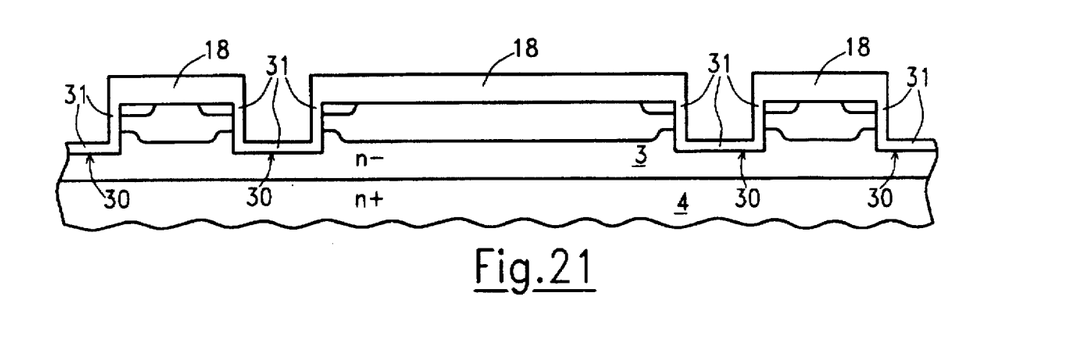

Referring to FIG. 21, the gate insulator 31 is formed on the walls of the trenches 30.

Figure 22:
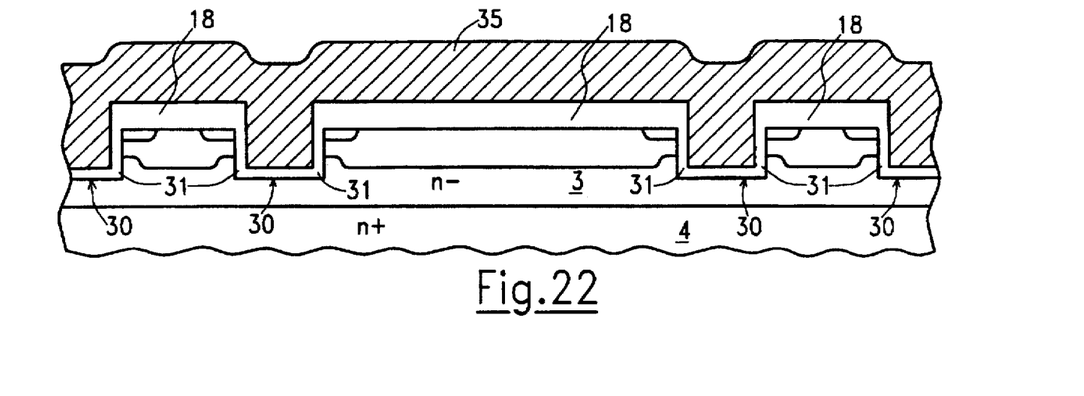

Referring to FIG. 22, the polysilicon layer 35 is deposited in a conventional manner such that it fills the trenches 30 and covers the oxide layer 18.

Figure 23:
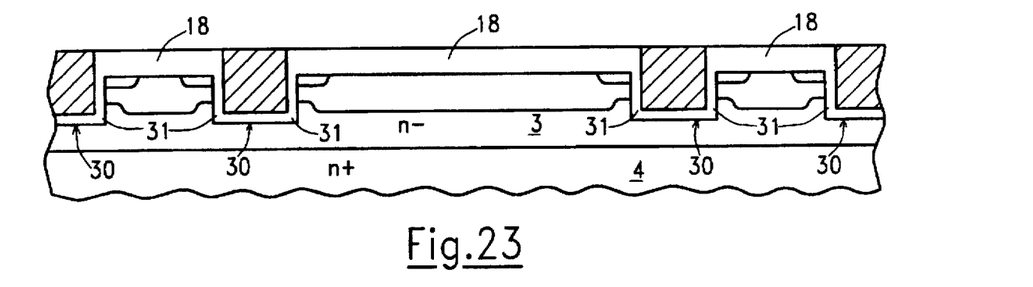

Referring to FIG. 23, the polysilicon layer 35 is etched back to expose the oxide layer 18, but to leave the trenches 30 filled with polysilicon.

Figure 24:
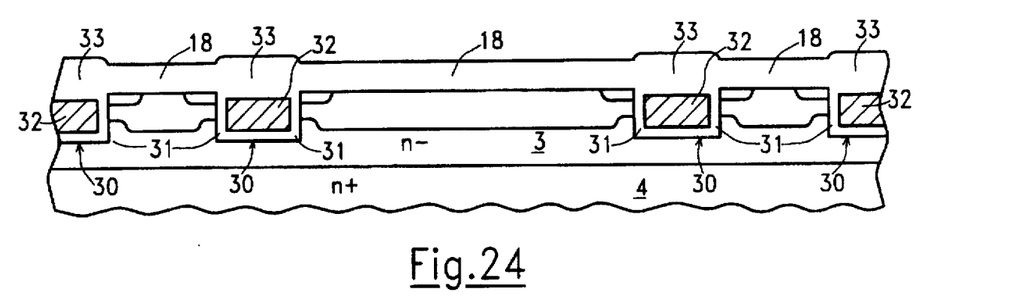

Referring to FIG. 24, the silicon dioxide caps 33 are formed over the exposed portions of the trenches 30.

Figure 25:
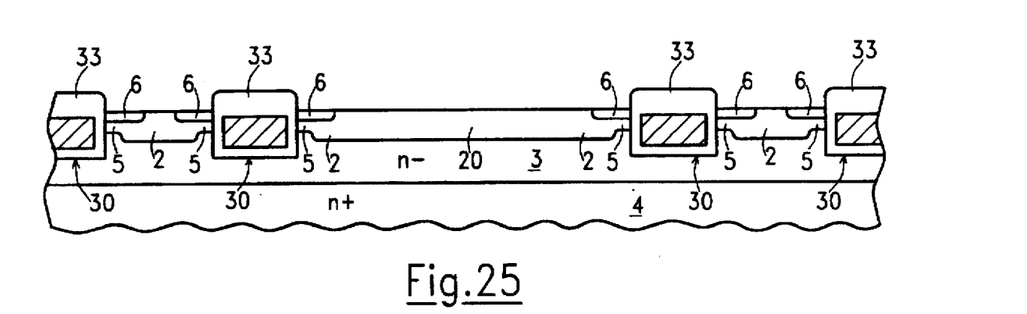

Referring to FIG. 25, the oxide layer 18 is then removed from the active areas of the cells 1a and 1b.

Figure 26:
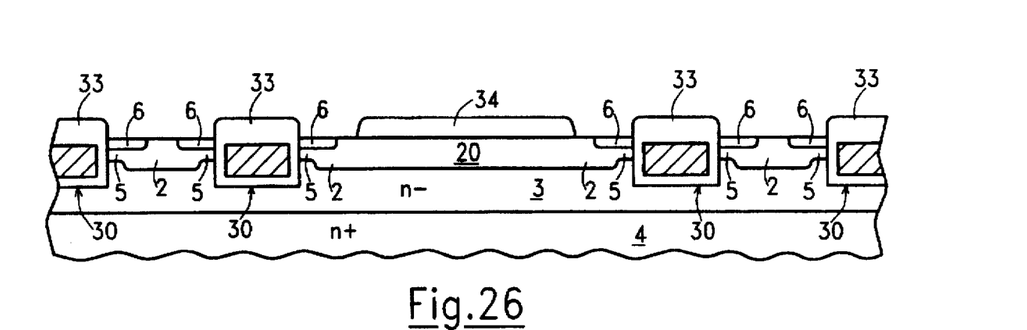

Referring to FIG. 26, the intermediate dielectric layer 34 is then deposited and patterned. Alternately, the oxide layer 18 may be masked, leaving a portion of the oxide layer 18 above the region 20. This remaining portion of the layer 18 forms the protective dielectric layer 34. The metal layer (not shown) is formed over the device and selectively etched to define the source electrodes Sa and Sb.

Based on the detailed description provided herein, those skilled in the art will recognize that the structure according to the invention can also be used in Insulated Gate Bipolar Transistors (IGBTs), simply by starting the fabrication process with a p-type, heavily doped substrate, on which an n-type epilayer similar to the epilayer 3 described before is then grown.

Also, the invention applies to p-channel devices; in this case it is necessary to substitute p-type regions for n-type regions and vice versa.

The invention applies also to integrated devices, where the drain electrode lies on the same surface as the source and gate electrodes; the modifications to the described process being known to those skilled in the art.

Although specific embodiments of the invention have been described for purposes of illustration, various modifications may be made, such as those described above, without departing from the spirit and scope of the invention, as will be recognized by those skilled in the art based on the description provided herein.

Accordingly, the invention is not limited by the disclosure, but instead its scope is to be determined entirely by reference to the following claims.

We claim:

1. A power device, comprising:

a semiconductor substrate;

a semiconductor layer of a first conductivity formed on said substrate and having a surface;

first and second trenches formed in said semiconductor layer and having first and second trench walls respectively;

first and second insulator layers formed within said first and second trenches on said first and second trench walls respectively;

first and second conductors formed within said first and second trenches on said first and second insulators respectively;

first and second regions of a second conductivity formed in said semiconductor layer and contiguous with said first and second trench walls respectively;

third and fourth regions of said first conductivity formed in said semiconductor layer and contiguous with said first and second trench walls and said first and second regions respectively;

a first body region of said second conductivity formed in said semiconductor layer and contiguous with said first and third regions respectively;

a second body region of said second conductivity formed in said semiconductor layer and contiguous with said second and fourth regions respectively;

a first electrode coupled to said third region and to said first body region;

a second electrode coupled to said fourth region and to said second body region; and an interconnecting body region of said second conductivity formed in said semiconductor layer and contiguous with said first and second body regions.

2. The device of claim 1 wherein said semiconductor substrate is of said first conductivity and has a first impurity concentration that is greater than a second impurity concentration of said semiconductor layer.

3. The device of claim 1 wherein said semiconductor substrate is of said second conductivity and has a first impurity concentration that is greater than a second impurity concentration of said semiconductor layer.

4. The device of claim 1 wherein said first and second regions have first and second impurity concentrations that are respectively less than third and fourth impurity concentrations of said first and second body regions.

5. The device of claim 1 wherein said interconnecting body region is coupled to said first and second electrodes such that said interconnecting body region composes an impedance element that is coupled between said first and second electrodes.

6. The device of claim 1, further comprising an extended semiconductor region of said first conductivity, said extended region contiguous with said interconnecting body region and coupled to said first and second electrodes such that said extended region and said interconnecting body region compose respective impedance elements that are coupled in parallel between said first and second electrodes.

7. The device of claim 1, further comprising an extended semiconductor region of said first conductivity, said extended region contiguous with said interconnecting body region.

8. The device of claim 1, further comprising an extended semiconductor region that is of said first conductivity and that is contiguous with both said fourth region and said interconnecting body region.

9. The device of claim 1 wherein said semiconductor substrate is of said first conductivity.

10. The device of claim 1 wherein said semiconductor substrate is of said second conductivity.

11. A power device, comprising:

a semiconductor substrate;

a semiconductor layer of a first conductivity formed on said substrate and having a surface;

first and second trenches formed in said semiconductor layer and having first and second trench walls respectively;

first and second insulator layers formed within said first and second trenches on said first and second trench walls respectively;

first and second conductors formed within said first and second trenches on said first and second insulators respectively;

first and second regions of a second conductivity formed in said semiconductor layer and contiguous with said first and second trench walls respectively;

third and fourth regions of said first conductivity, formed in said semiconductor layer and contiguous with said first and second trench walls and said first and second regions respectively;

a first body region of said second conductivity formed in said semiconductor layer and contiguous with said first and third regions respectively;

a second body region of said second conductivity formed in said semiconductor layer and contiguous with said second and fourth regions respectively;

an interconnecting body region of said second conductivity formed in said semiconductor layer and contiguous with said first and second body regions;

wherein said first conductor, insulator layer, first region, first body region, and third region compose a power cell;

wherein said second conductor, insulator layer, second region, second body region, and fourth region compose a sensing cell; and wherein said interconnecting body region composes an impedance device coupled between said power and sensing cells.

12. A power device, comprising:

semiconductor substrate;

semiconductor layer of a first conductivity formed on said substrate and having a surface;

first and second trenches formed in said semiconductor layer and having first and second trench walls respectively;

first and second insulator layers formed within said first and second trenches on said first and second trench walls respectively;

first and second conductors formed within said first and second trenches on said first and second insulators respectively;

first and second regions of a second conductivity formed in said semiconductor layer and contiguous with said first and second trench walls respectively;

third and fourth regions of said first conductivity formed in said semiconductor layer and contiguous with said first and second trench walls and said first and second regions respectively;

a first body region of said second conductivity formed in said semiconductor layer and contiguous with said first and third regions respectively;

a second body region of said second conductivity formed in said semiconductor layer and contiguous with said second and fourth regions respectively;

an interconnecting body region of said second conductivity formed in said semiconductor layer and contiguous with said first and second body regions;

wherein said first conductor, insulator layer, first region, and third region respectively compose a gate, gate insulator, channel, and source of a power cell;

wherein said second conductor, insulator layer, second region, and fourth region respectively compose a gate, gate insulator, channel, and source of a sensing cell; and wherein said interconnecting body region composes a resistor coupled between said power and sensing cells.

13. A power device, comprising:

a semiconductor substrate;

a semiconductor layer of a first conductivity formed on said substrate and having a surface;

first and second trenches formed in said semiconductor layer and having first and second trench walls respectively;

first and second insulators layers formed within said first and second trenches on said first and second insulators respectively;

first and second conductors formed within said first and second trenches on said first and second insulators respectively;

first and second regions of a second conductivity formed in said semiconductor layer and contiguous with said first and second trench walls respectively;

third and fourth regions of said first conductivity formed in said semiconductor layer and contiguous with said first and second trench walls and said first and second regions respectively;

a first body region of said second conductivity formed in said semiconductor layer and contiguous with said first and third regions respectively;

a second body region of said second conductivity formed in said semiconductor layer and contiguous with said second and fourth regions respectively;

an interconnecting body region of said second conductivity formed in said semiconductor layer and contiguous with said first and second body regions;

wherein said first body region has a first impurity concentation;

wherein said second body region has a second impurity concentration; and wherein said interconnecting body region has a third impurity concentration that is substantially less than both of said first and second impurity concentrations.

* * * * *